United States Patent [19]
Tamaki et al.

[11] Patent Number: 6,157,080
[45] Date of Patent: Dec. 5, 2000

[54] SEMICONDUCTOR DEVICE USING A CHIP SCALE PACKAGE

[75] Inventors: Kazuo Tamaki, Kyoto; Yasuyuki Saza, Tenri; Yoshihisa Dotta, Nara, all of Japan

[73] Assignee: Sharp Kabushiki Kaisha, Osaka, Japan

[21] Appl. No.: 09/186,339

[22] Filed: Nov. 5, 1998

[30] Foreign Application Priority Data

Nov. 6, 1997 [JP] Japan .................................... 9-304021
Oct. 30, 1998 [JP] Japan .................................. 10-311095

[51] Int. Cl.⁷ ................................................ H01L 23/52
[52] U.S. Cl. .......................... 257/738; 257/778; 257/780; 257/784; 257/787; 257/790
[58] Field of Search .................... 257/738, 777, 257/778, 780, 787, 790, 737, 774, 779, 782, 784, 786, 783; 438/107, 108, 109, 124, 126, 127, 51, 118

[56] References Cited

U.S. PATENT DOCUMENTS

| | | | |
|---|---|---|---|
| 5,008,733 | 4/1991 | Mine et al. | 257/702 |
| 5,210,938 | 5/1993 | Hirai | 29/840 |
| 5,385,869 | 1/1995 | Liu et al. . | |
| 5,640,052 | 6/1997 | Tsukamoto | 257/781 |
| 5,697,148 | 12/1997 | Lance, Jr. et al. | 29/840 |
| 5,844,320 | 12/1998 | Ono et al. | 257/778 |
| 5,889,326 | 3/1999 | Tanaka | 257/737 |

FOREIGN PATENT DOCUMENTS

| | | |
|---|---|---|
| 559 366 A1 | 9/1993 | European Pat. Off. . |
| 684 641 A2 | 11/1995 | European Pat. Off. . |
| 725 434 A2 | 8/1996 | European Pat. Off. . |
| 63A-84128 | 4/1988 | Japan . |
| 63-104343 | 5/1988 | Japan . |
| 01122459 | 5/1989 | Japan . |
| 04028260 | 1/1992 | Japan . |
| 4-154157 | 5/1992 | Japan . |
| 6-089914 | 3/1994 | Japan . |
| 06177323 | 6/1994 | Japan . |
| 2 301 937 | 12/1996 | United Kingdom . |
| WO 97/17727 | 5/1997 | WIPO . |

*Primary Examiner*—Olik Chaudhuri
*Assistant Examiner*—Alonzo Chambliss

[57] ABSTRACT

A semiconductor device package which eliminates the possibility of damages to a solder connected portion of a flip-chip connected chip by load, or which eliminates ultrasonic output at the time of wire bonding is described. Electrodes of a first chip are connected to first connection pads corresponding to the electrodes with the first chip being bonded at its rear surface to a rear surface of a second chip. A first resin is interposed in a gap between the first chip and a circuit board so as not to cover the first or second connection pads. Thereafter, the electrode of the second chip is connected to the second connection pads by wires, and the whole device is overlayed by a second resin.

20 Claims, 14 Drawing Sheets

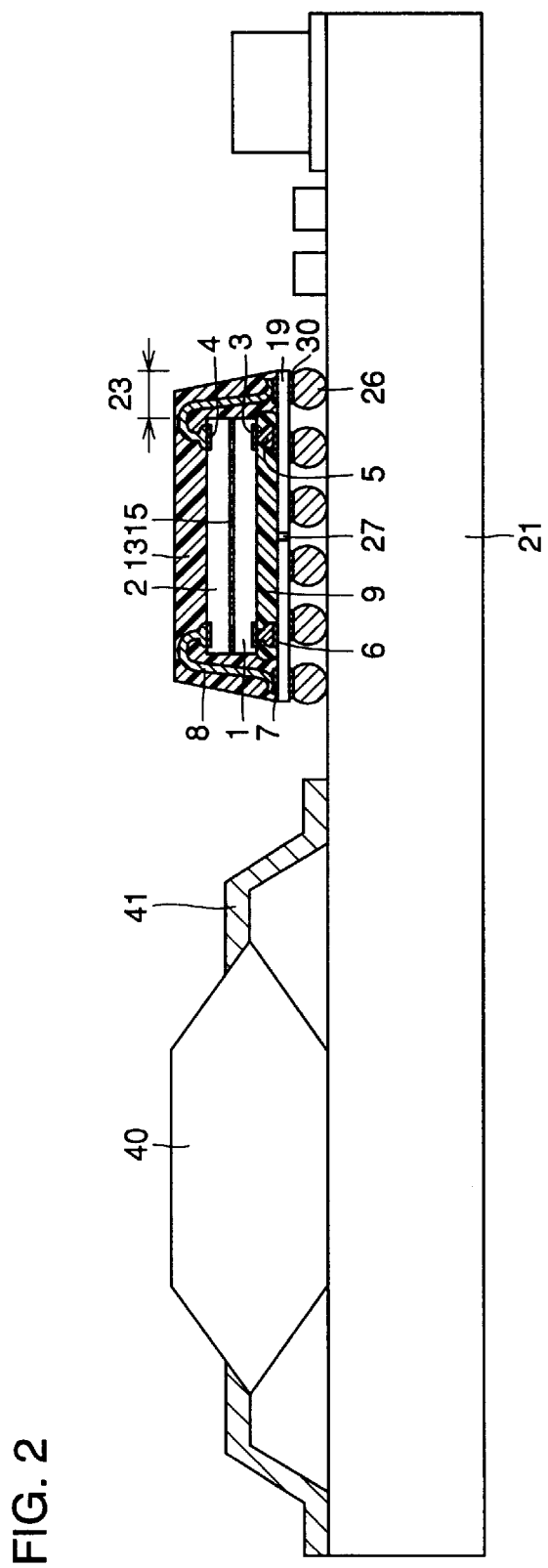

SEMICONDUCTOR DEVICE USING A CHIP SCALE PACKAGE

BACKGROUND OF THE INVENTION

1. Field of the Invention

The present invention relates to a semiconductor device package having a semiconductor device including one or a plurality of semiconductor chips (hereinafter referred to as "chips"), mounted on a substrate, and to a manufacturing method thereof. More specifically, the present invention relates to a semiconductor device package use for flip chip type CSP (Chip Size Package) and manufacturing method thereof.

2. Description of the Background Art

Reduction in size and weight of portable information processing equipments require higher density, smaller size and reduced thickness of a semiconductor device package. A prior art technique proposed to meet the demand includes "a hybrid integrated circuit device" in accordance with Japanese Patent Laying-Open No. 63-84128.

FIG. 15 is a cross sectional view showing the structure of the prior art hybrid integrated circuit device.

Referring to FIG. 15, the hybrid integrated circuit device utilizes COX (Chip on X: X denotes a substrate material selected from an organic film, a printed board, a glass, a silicon wafer and the like) in which an LSI is mounted as a bare chip, on a circuit board. More specifically, a first chip 1 is connected on a thick substrate 21 by a solder connection portion 22, in accordance with the flip chip method.

A second chip 2 is die-bonded to the first chip 1 with rear surfaces of the chips facing to each other, by means of an adhesive 15. The second chip is further connected to thick substrate 21 by wire bonding, through wire 8.

Further, the first and second chips are coated to be covered entirely by a chip coat resin 20.

Another SMD (Surface Mount Device) 40 is mounted by means of a lead 41 as shown in the figure, on thick substrate 21.

However, in the conventional mounting structure shown in FIG. 15, the chip is directly mounted on thick substrate 21 and not packaged. Therefore, it is not possible to implement the mounting structure shown in FIG. 15 on the thick substrate simply by the step of conventional SMD (Surface Mount Technology) in which reflow soldering is performed collectively after components are mounted.

More specifically, in order to implement the mounting structure shown in FIG. 15, it is necessary to newly add, to an existing assembly line of each plant, a dedicated production line including a flip-chip-mounting apparatus, a die bonding apparatus, a wire bonding apparatus and a chip coating apparatus. This requires considerable capital investment.

In the mounting structure shown in FIG. 15, the chip is not packaged. Therefore, if it is found after mounting that the mounted chip is defective, it has been difficult to replace only the defective chip.

Further, in the prior art example shown in FIG. 15, the first chip is connected to the circuit board in accordance with the flip chip method and, thereafter, the second chip is connected to the circuit board by wire bonding. This possibly causes a problem that the solder connecting portion 22 of the flip-chip-connected first chip 1 is damaged by load or ultrasonic output at the time of wire bonding of the second chip, resulting in failure of electrical connection. Further, as the entire mounted structure is chip coated, chip coat resin 20 extends considerably wide, causing a problem that a length 24 from a chip edge to an outer periphery of a mold is made too long.

Conventionally, it has been a common practice to introduce a resin into a gap between a chip and the substrate in a structure where only one chip not having a stacked structure is flip-chip-mounted, in order to relax thermal stress derived from difference in coefficient of thermal expansion. The amount of resin introduced, however, has not been studied at all.

As the LSI comes to have higher density, larger number of pins and, eventually, finer pitch, the gap between the chip and the substrate naturally becomes narrower. For a stacked type CSP (Chip Size Package), one having the gap between the chip and the interconnection of 25 to 30 μm and the gap between the chip and the substrate of about 50 μm has been under development. In order to fill a sealing resin into such a narrow gap, viscosity of the resin should naturally be made lower.

If the viscosity of resin is low, however, there possibly arises a problem that a large fillet (flow out of the resin) is formed at a chip edge, as will be described later.

SUMMARY OF THE INVENTION

An object of the present invention is to solve the above described problems encountered when a semiconductor device having first and second device forming surfaces is mounted on a circuit board, and to provide a semiconductor device package allowing manufacturing through similar process steps to the conventional SMT steps, as well as to provide manufacturing method thereof Another object of the present invention is to provide a semiconductor device package in which a connection portion between a circuit board and an electrode of a flip-chip-connected first device forming surface is not damaged even by wire bonding when an electrode formed on a second device forming surface is connected to the circuit board, and to provide manufacturing method thereof.

A still further object of the present invention is to provide a semiconductor device package including both a semiconductor device connected in accordance with the flip chip method an a semiconductor device connected by wire bonding, which can be manufactured at a relatively low temperature through simple process steps, and to provide manufacturing method thereof.

According to an aspect of the present invention, a semiconductor device package is provided. The semiconductor device package includes: a semiconductor device having first and second device forming surfaces including a plurality of first electrodes formed at a peripheral portion of the first device forming surface and a plurality of second electrodes formed at a peripheral portion of the second device forming surface; a circuit board having first and second surfaces for mounting the semiconductor device, including a plurality of first connection pads arranged corresponding to the first electrodes of the semiconductor device on the first surface, a plurality of second connection pads formed at an outer periphery of the first connection pads on the first surface, and a plurality of external input/output terminals electrically connected to the first and second connection pads respectively; a first resin provided in a gap between the first device forming surface and the circuit board; a plurality of metal members for adhesion for connecting the first connection pads with corresponding first electrodes respectively in accordance with the flip chip method; metal wires connecting the second connection pads with the corresponding second electrodes respectively; and a second resin molded to cover the entire semiconductor device.

According to the present invention, as a package structure is adopted, the conventional SMD steps can be utilized in the similar manner as for other SMDs (Surface Mount Devices).

According to the present invention, the first electrodes formed on the first device forming surface are bare chip mounted in accordance with the flip chip method to the circuit board, and a first resin is interposed between the first device forming surface and the circuit board. Because of this interposed first resin, the damage at a connecting portion between the circuit board and the flip-chip-connected first electrodes formed on the first device surface caused by the load or ultrasonic output at the time of wire bonding for connecting the second electrodes formed on the second device forming surface can be prevented, and therefore failure in electrical connection can be prevented.

Further, the first resin also has a function of relaxing thermal stress derived from difference in coefficients of thermal expansion, when the semiconductor device and the circuit board have much different coefficients of thermal expansion.

Especially when applied to a CSP which is a package having short distance between a chip edge and a package edge, the present invention prevents overlapping of the first resin on the second pads to be connected to the second electrodes on the second device forming surface.

According to the present invention, the first resin is not overlapped on the second connection pads for connection to the second electrodes on the second device forming surface, and therefore successful electrical connection with the second electrodes on the second device forming surface is ensured. Further, for the purpose of protecting the connection portion of the first electrode on the first device forming surface and the wire connecting portion of the second electrodes on the second device forming surface, when the circuit board is held by a molding tool to mold a mounting surface with a second resin, the molding tool can be kept airtight. Flowing of the second resin to the outside can be prevented, and possible damage to the molding tool by the filler contained in an interface sealing resin, which is the first resin, can be eliminated.

In the present invention, it is possible to form the metal member for adhesion on the first connection pad of the circuit board. When an outermost layer of the first electrode pad of the circuit board is of Au and the outermost layer of the first electrodes on the first device forming surface is of Al-1% Si, for example, assume that a material containing Au as a main component is used as the metal member for adhesion on the circuit board and that thermocompression boning is adapted as a method of connecting to the first electrode on the first device forming surface. Here, thermocompression bonding is between Au an Al-1% Si, which allows connection at a relatively low temperature.

When a metal member for adhesion is formed on the first electrode on the first device forming surface, connection would be between Au and Au, which means that a relatively high temperature is necessary for thermocompression bonding. Because of this reason, diffusion of Al-1% Si of the first electrode on the first device forming surface and the metal member for adhesion formed of Au connected in advance proceeds too far. As a result, a step of forming a barmer metal on the outermost layer of the chip electrode becomes necessary. By contrast, when the metal member for adhesion is formed on the circuit board, there is an advantage that the step of forming barrier metal is unnecessary.

In the structure of a semiconductor device package in accordance with one aspect of the present invention, the semiconductor device may be provided having two semiconductor chips with rear surfaces of the chips bonded to each other.

In a structure of the semiconductor device package in accordance with an aspect of the present invention, the semiconductor device may be provided with one semiconductor chip having both front and rear surfaces as device forming surfaces.

According to the present invention, a semiconductor device is used which has elements formed on the front and rear surfaces of one semiconductor device, in place of two chips. Therefore, the height of the package can be reduced without impairing the effects of the present invention.

In a structure of a semiconductor device package in accordance with one aspect of the present invention, the first resin may be inserted to a gap between the first device forming surface and the circuit board such that an outer peripheral portion of the first resin extends outer than that region where the first connection pads are formed and inner than that region where the second connection pads are formed.

According to the present invention, the first resin extends with its outer peripheral portion positioned outer than that region where the first connection pads formed on the circuit board are formed and inner than that region where the second connection pads are formed. Therefore, there is no factor hindering airtighteness of the molding tool, and possibility of any damage to the molding tool is eliminated. If the semiconductor device is a KGD (Known Good Die) and it is not likely that repairing is necessary, this approach in which the first connection pad is covered by the first resin is effective. The reason is as follows. The area to which the first resin is introduced is large and therefore, if a filler for decreasing thermal expansion coefficient is contained in the resin, the difference in thermal expansion coefficients between the semiconductor device and the circuit board is reduced. Therefore, thermal stress can further be relaxed.

The invention is characterized in that in view of the problems of the prior art, the area of flow out of the first resin is made smaller and the resin interposed between the first device forming surface and the circuit board is limited within a prescribed region.

In a structure of a semiconductor device package in accordance with an aspect of the present invention, the first resin may exists in the gap between the first device forming surface and the circuit board such that the outer peripheral portion of the first resin is positioned inner than that region where the first connection pads are formed.

The invention in accordance with this aspect also is characterized in that in view of the problems of the prior art, the region of flow out of the first resin is made smaller and the resin interposed between the first device forming surface and the circuit board is limited within a prescribed region.

According to the present invention, when the first resin is introduced to the gap between the first device forming surface of the semiconductor device and the circuit board, the resin is introduced only in that region which is inner than the first connection pads formed on the circuit board. Therefore, extension of the first resin does not reach the first electrodes at the peripheral portion of the first device forming surface but is suppressed at the central portion of the first device forming surface. Therefore, the first connection pads on the circuit board are not covered by the first resin. This facilitates mounting of a chip for repairing.

In a structure of a semiconductor device package in accordance with an aspect of the present invention, the first resin may be a thermoplastic resin and the second resin may be a thermosetting resin.

As the first resin, a material having heat resistance of at least 300° C. and thermal expansion coefficient of about −10 to about 100 ppm is preferable. More specifically, polyimide, for example, may be used. The first resin is not limited to the thermoplastic resin, an a thermosetting resin such as epoxy, for example, may be used provided that it has high viscosity at a room temperature.

As the second resin, epoxy or the like having low hygroscopicity may be used. When a mold resin conventionally used for general LSI package is used as the second resin, a step of assembly which is well fitted to the existing process can be realized.

In the structure of a semiconductor device package in accordance with one aspect of the present invention, the metal member for adhesion may contain Au as a main component.

In a structure of a semiconductor device package in accordance with an aspect of the present invention, the metal member for adhesion may include a first portion formed of a first metal and a second portion formed of a second metal.

In a structure of a semiconductor device package in accordance with an aspect of the present invention, the first portion is formed of a metal containing Au as a main component, and the second portion may be formed of solder.

In a structure of a semiconductor device package in accordance with one aspect of the present invention, the external input/output terminals are arranged in a matrix on a second surface of the circuit board, and each external input/output terminal may be formed by a third connection pad provided on the second surface and a solder ball provided on the third connection pad.

According to the present invention, the external input/output terminals are arranged in a matrix on a rear surface of the circuit board on which the semiconductor device is mounted. Therefore, the number of terminals can be increased than when the external input/output terminals are arranged at the periphery of the package, and hence the conventional process step of SMT can be employed.

In a structure of a semiconductor device package in accordance with one aspect of the present invention, the circuit board has openings for connection arranged in a matrix, and the external input/output terminals may be formed by solder balls connected through the openings to the first and second connection pads.

According to the present invention, the external input/output terminals are arranged in a matrix on the rear surface of the circuit board on which the semiconductor device is mounted. Therefore, the number of terminals can be increased than when the external input/output terminals are arranged at the periphery of the package, and hence the conventional step of SMT can be employed.

According to another aspect of the present invention, a method of manufacturing a semiconductor device package is provided. The method of manufacturing the semiconductor device package is for manufacturing a semiconductor device package having a semiconductor device with first and second device forming surfaces mounted on a circuit board, and the method includes the steps of: connecting first electrodes formed on a peripheral portion of a first device forming surface to first connection pads formed on a first surface of the circuit board by means of metal members for adhesion in accordance with flip chip method with a first resin interposed in a gap between the first device forming surface and the circuit board; connecting second electrodes formed at a peripheral portion of a second device forming surface to second connection pads formed outer than the first connection pads on the first surface of the circuit board by means of metal wires in accordance with wire bonding; resin molding with a second resin, to cover the semiconductor device mounted on the circuit board entirely; and providing solder balls on a plurality of third connection pads provided on the circuit board.

In the method of manufacturing a semiconductor device package in accordance with another aspect of the present invention, the step of connecting with the first resin interposed in the gap between the first device forming surface and the circuit board may include the steps of applying the first resin at a central portion of the first device forming surface and connecting the first electrodes to the first connection pads.

The present invention provides a method of effectively interposing the first resin. When a wafer before dicing into chips is used, the first resin may be applied to an entire surface of the wafer, unnecessary portions may be removed chemically or physically and thereafter the wafer may be diced into chips. In this case, the first device forming surface can be utilized with the first resin already applied thereto. When a semiconductor device which is already diced is used, the first resin may be applied to the circuit board. In this manner, the first resin may be flexibly applied.

In the method of manufacturing a semiconductor device package in accordance with another aspect of the present invention, in the step of applying the first resin, the first resin having a sheet shape may be arranged at a central portion of the first device forming surface.

As to the method of placing the sheet-shaped first resin, a sheet cut into a prescribed size containing a prescribed amount determined in accordance with extension of the resin which is influenced by resin characteristics such as viscosity and glass transition temperature of the resin may be placed or temporarily bonded with pressure on the first device forming surface.

In accordance with the present invention, as the sheet-shaped first resin is used, the amount of applied resin can be made constant, and efficiency in working can be improved.

In the method of manufacturing a semiconductor device package in accordance with another aspect of the present invention, the step of connecting with the first resin interposed in the gap between the first device forming surface and the circuit board may include the steps of preparing a circuit board having the first resin applied at the central portion, and connecting the first electrodes to the first connection pads.

The present invention provides a method of effectively interposing the first resin. When a wafer before dicing into chips is used, the first resin may be applied on an entire surface of the wafer, unnecessary portions may be removed chemically or physically and thereafter the wafer may be diced into chips. In this case, the first device forming surface may be utilized with the first resin already applied thereon. When the semiconductor device which is already divided is used, the first resin may be applied to the circuit board. In this manner, the resin may be applied flexibly.

In the method of manufacturing a semiconductor device package in accordance with another aspect of the present invention, in the step of preparing the circuit board, the first resin having a sheet shape may be arranged at the central portion of the circuit board.

In accordance with the present invention, as the sheet-shaped first resin is used, the amount of resin applied can be kept constant, and efficiency in working can be improved.

In the method of manufacturing a semiconductor device package in accordance with another aspect of the present invention, in the step of connecting with the first resin interposed in the gap between the first device forming surface and the circuit board, the amount of first resin used may be adjusted such that the outer peripheral portion of the first resin extends to be outer than the region where the first connection pads are formed and inner than the region where the second connections pads are formed.

In the method of manufacturing a semiconductor device package in accordance with another aspect of the present invention, in the step of connecting with the first resin interposed in the gap between the first device forming surface and the circuit board, the amount of first resin used may be adjusted such that the outer peripheral portion of the first resin extends inner than the region where the first connection pads are formed.

The method of manufacturing a semiconductor device package in accordance with an aspect of the present invention may further include the steps of: after the second electrodes are connected to the second connection pads and before molding the second resin, testing the semiconductor device and removing the mounted semiconductor device from the circuit board if the device is found to be defective; when the semiconductor device is removed from the circuit board, connecting first electrodes formed on a peripheral portion of a first device forming surface of another semiconductor device different from the removed device to first connection pads formed on a first surface of the circuit board by means of metal members for adhesion in accordance with the flip chip method with a first resin interposed in the gap between the first device forming surface and the circuit board; and when the semiconductor device is removed from the circuit board, connecting second electrodes formed at a peripheral portion of a second device forming surface of another semiconductor device with second connection pads formed outer than the first connection pads on the first surface of the circuit board by means of metal wires in accordance with wire bonding method.

According to the present invention, before mold packaging with the second resin, electric characteristic is tested. Therefore, when the first or the second chip is defective, the ratio of good products can be improved by rep airing.

In the manufacturing method of a semiconductor device package in accordance with another aspect of the present invention, the metal member for adhesion may include a first portion formed of a first metal and a second portion formed of a second metal.

According to the present invention, the metal member for adhesion includes a first portion of a first metal and a second portion of a second metal. When a metal such as solder having low melting point is used as one of the portions of the metal member, it becomes possible to connect the first chip to the circuit board in accordance with the flip chip method at a relatively low temperature, and therefore damage to the circuit board or to the semiconductor chip can be suppressed. Especially when a thin flexible substrate such as a polyimide tape is used as the circuit board, it becomes possible to suppress warpage or waviness caused by heating. Therefore, the subsequent steps of connecting the second chip to the circuit board by wire bonding to molding of the semiconductor device entirely can further be facilitated.

In the method of manufacturing a semiconductor device package in accordance with another aspect of the present invention, the step of connecting the first electrodes to the first connection pads by the flip chip method may include the steps of: supplying solder onto the first connection pads; forming a bump formed of a metal containing Au as a main component on the first electrodes; and connecting the first electrodes with the first connection pads by heating and melting the solder supplied onto the first connection pads.

In the method of manufacturing a semiconductor device package in accordance with another aspect of the present invention, in the step of supplying solder onto the first connection pad, the solder may be supplied by ball bonding method.

According to the present invention, the solder can be supplied onto the first connection pad not overlapped on the second connection pads. Therefore, the steps of forming and removing a mask as required when the solder is supplied in accordance with super juffit method or super solder method are unnecessary, and the number of process steps can be reduced. Further, a small amount of solder can be supplied stably with high precision even to fine pads with narrow pitch, which supply is difficult in accordance with printing method.

In the method of manufacturing a semiconductor device package in accordance with another aspect of the present invention, in the step of supplying solder onto the first connection pad, the solder may be supplied by wedge bonding method.

According to the present invention, the solder is pressed and squashed and pressure bonded by ultrasonic wave. Therefore, different from the ball bonding method, reducing atmosphere for preventing oxidation is not necessary, and hence cost for facility can be reduced. When a solder wire having one same diameter is used, it is possible to form a smaller solder protruded electrode in accordance with the wedge bonding method. It is possible to control and supply such a small amount of solder that does not cause any short-circuit between solders of adjacent metal protruded electrodes when the solder is pressed and squashed under pressure at the time of flip chip connection, to pads having narrow pitch.

The method of manufacturing a semiconductor device package in accordance with another aspect of the present invention may further include the step of applying a flux to the solder supplied onto the first conduction pads, putting the circuit board into a reflow furnace, so as to shape the solder into hemispherical shape.

According to the present invention, even when the supplied solder protruded electrode comes to have long tail, any trouble can be prevented as the shape is adjusted.

In accordance with a still further aspect of the present invention, a circuit board is provided. The circuit board is for manufacturing a semiconductor device package on which a semiconductor device having first and second device forming surfaces is mounted, and the circuit board includes: a substrate having first and second surfaces and at least one through hole; first connection pads formed for connection with first electrode formed at a peripheral portion of the first device forming surface and arranged surrounding the through hole on the first surface; second connection pads for connection with second electrodes formed at a peripheral portion of the second device forming surface and formed outer than the first connection pads on the first surface; and a first resin applied on that region which is surrounded by the first connection pads.

In the structure of the circuit board in accordance with a still further aspect of the present invention, the substrate is formed of a resin having glass transition temperature of 200° C. or higher, and the circuit board may further include third connection pads and metal wires for connecting each of the third connection pads to corresponding first or second connection pad.

According to the present invention, a resin having glass transition temperature of at least 200° C., for example, a flexible substrate including polymide and metal wires is used as the circuit board. Therefore, the circuit board is heat-resistant, and efficiency in working at the time of molding can be improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a cross sectional view showing the semiconductor device package shown in FIG. 1 mounted on a thick substrate.

DESCRIPTION OF THE PREFERRED EMBODIMENTS

Figure 1:
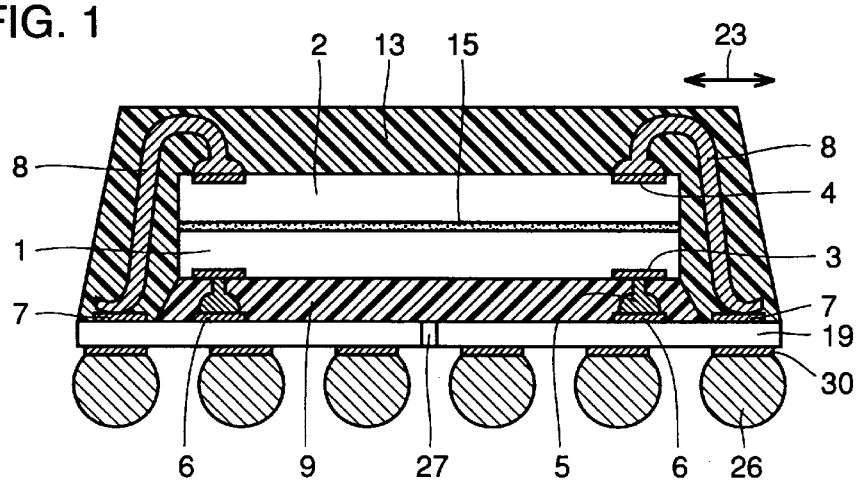
FIG. 1 is a cross sectional view showing a structure of a semiconductor device package in accordance with a first embodiment of the present invention.

FIG. 1 is a cross sectional view showing a structure of a semiconductor device package in accordance with a first embodiment of the present invention.

Referring to FIG. 1, in the semiconductor device package, a first chip 1 and a second chip 2 are mounted on a circuit board 19. The first and second chips 1 and 2 have rear surfaces adhered to each other by means of an adhesive 15. In the semiconductor package, an exemplary combination of the first and second chips 1 and 2 may include a 16M FLASH memory and a 2M SRAM.

A plurality of first electrodes 3 are formed at a peripheral portion of the first chip 1. A plurality of second electrodes 4 are formed at a peripheral portion of the second chip 2.

The electrodes 3 formed on the first chip 1 are connected to first connection pads 6 on a surface of the circuit board with metal members 5 interposed, by flip chip method. The electrodes 4 formed on the second chip are connected to second connection pads 7 formed outer than the first connection pads 6 on the surface of the circuit board by metal wires 8 in accordance with wire bonding method. The first and second chips 1 and 2 are molded by a second resin 13 to be covered entirely.

On the rear surface of circuit board 19, third connection pads 30 are formed in a matrix, and on the third connection pads 30, solder balls 26 are formed.

In the present embodiment, a first resin 9 is interposed in the gap between the first chip 1 and circuit board 19 such that the outer peripheral portion of the resin extends to be outer than the region where the first connection pads 6 are formed but inner than the region where the second connection pads 7 are formed.

FIG. 2 is a cross sectional view showing the semiconductor device package shown in FIG. 1 mounted on a thick substrate 21. Referring to FIG. 2, the semiconductor device package shown in FIG. 1 is connected to thick substrate 21 by means of solder balls 26.

The method of manufacturing the semiconductor device package having the above described structure will be described with reference to the figures.

Figure 3A:
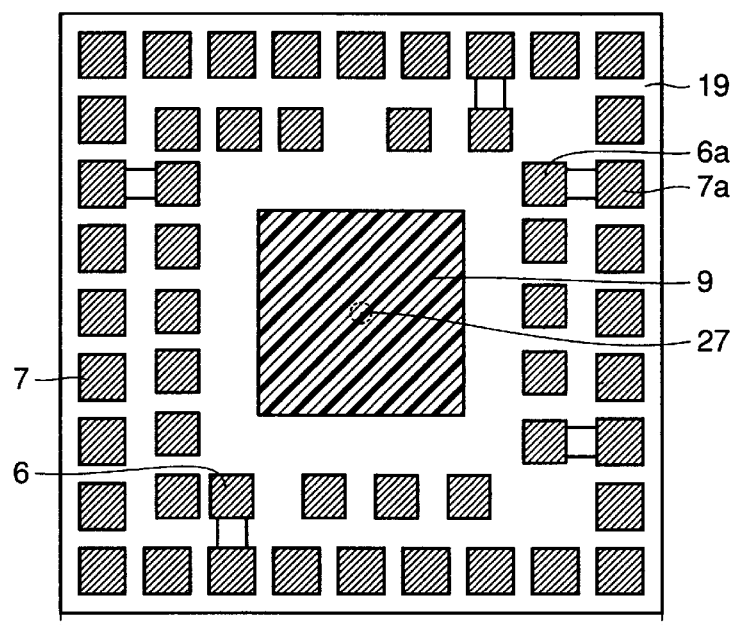
FIGS. 3A and 3B show a circuit board used for the semiconductor device package in accordance with the first embodiment of the present invention.
Figure 3B:
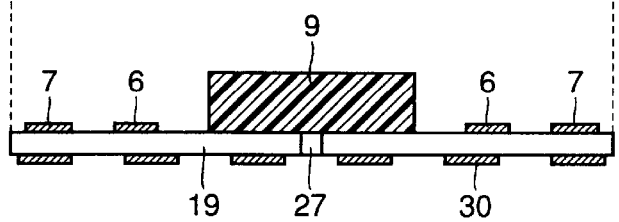

FIGS. 3A and 3B show an example of the circuit board used for the semiconductor device package in accordance with the present invention in which FIG. 3A is a plan view and FIG. 3B is a cross section. Referring to FIGS. 3A and 3B, on circuit board 19, a plurality of first connection pads 6 are formed on the surface for connection with the electrodes of the first chip. In a region on the outer periphery of the first connection pads 6, second connection pads 7 are formed for connection with the electrodes of the second chip.

The first and second connection pads 6 and 7 may be connected to each other as represented by the first connection pad 6a and a second connection pad 7a, for example. The arrangement of the first and second connection pads 6 and 7 is not limited to the one shown in the figure.

A first resin 9 is applied to that region of the substrate which is surrounded by the first connection pads. At least one through hole 27 is provided in the substrate in the region surrounded by the first connection pads. The through hole 27 has a function of preventing expansion of the first resin 9 during reflow, after the resin absorbs moisture.

FIGS. 4A to 4E show an example of process steps for manufacturing the semiconductor device package shown in FIG. 1.

Figure 4A:
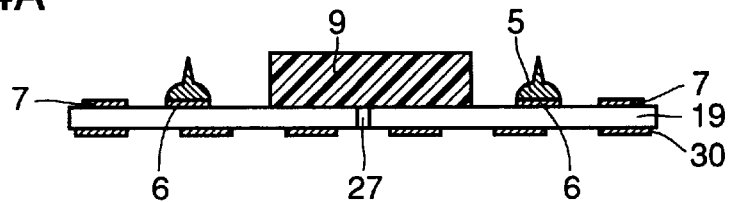
FIGS. 4A to 4E are cross sectional views showing the steps of manufacturing the semiconductor device package in accordance with the first embodiment of the present invention.

Referring to FIG. 4A, first, metal protruded electrodes are formed by using a metal member 5, on connection pads 6 of circuit board 19 shown in FIGS. 3A and 3B. In the present embodiment, a substrate including polyimide having glass transition temperature of at least 200° C. and metal interconnections is used as the circuit board.

Using an Au wire having the diameter of $\phi 20$ $\mu$m and through wire bonding, the metal protruded electrode having the diameter of about 80 $\mu$m is formed. For forming the metal protruded electrode, plating or the like may be utilized.

In the present embodiment, as a method of interposing the first resin 9 in the gap between the first chip 1 and circuit board 19, the first resin 9 in the shape of a sheet is applied in advance at the central portion of circuit board 19.

Here, in the present embodiment, a thermoplastic polyimide film TP-T manufacture by Kanegafuchi Corporation having a square shape of 5.8 mm×5.8 mm is used as the first resin sheet 9. The resin has the following characteristics: glass transition temperature (Tg) of 190° C. and modulus in tension (tested by ASTM D882) near the connection temperature (about 300° C.) of 0.1 to 10 MPa.

The sheet has a thickness of 40 $\mu$m. The method of applying the first resin 9 is not limited thereto, and the first resin 9 in liquid shape may be potted by a prescribed amount, using a dispenser, for example.

Figure 16:
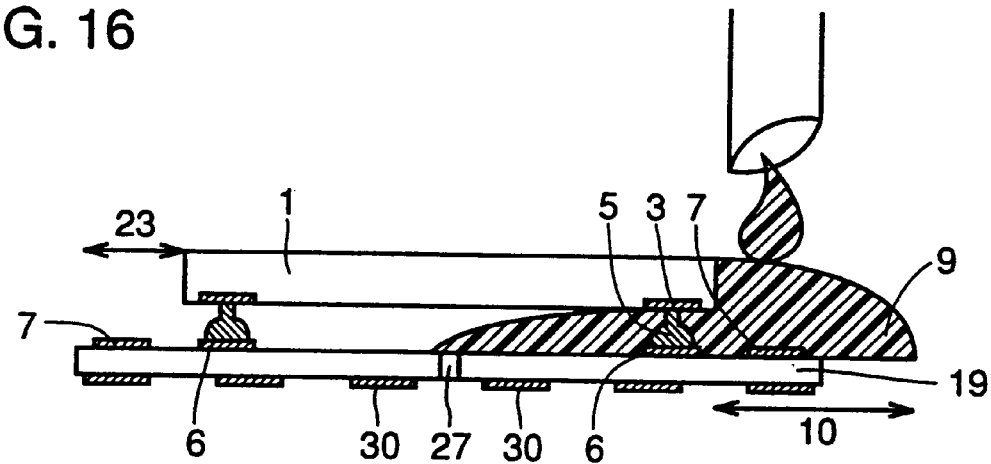
FIGS. 16 to 19, 20A and 20B are cross sectional views related to the problem newly arises when the present invention is applied to CSP.

Here, in the present invention, the method of interposing the first resin in the gap between the first device forming surface and the circuit board includes a method of potting liquid sealing resin 9 at an edge of chip 1 and penetrating the sealing resin 9 to the gap between the chip 1 and circuit board 19 utilizing capillary action, as shown in FIG. 16. Though this is the simplest method, it is necessary to ensure a potting region 10 on the circuit board 19. When the first connection pads 6 and the second connection pads 7 formed on circuit board 19 are distant, sufficient potting region 10 can be ensured.

Figure 17:
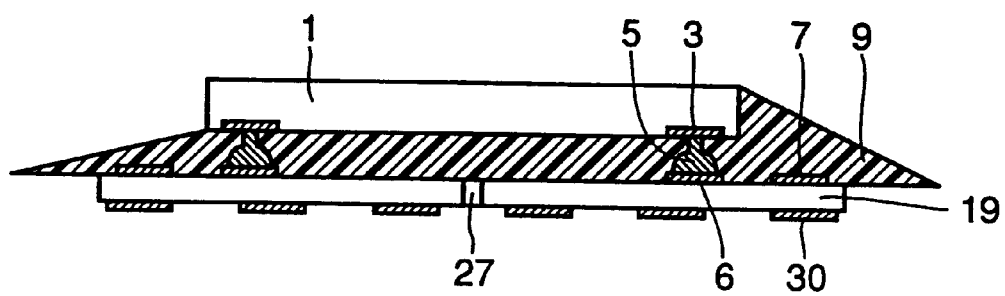

In a CSP which is a package of which size is closer to the chip size, however, a distance 23 between a chip edge and a package edge is short. Therefore, when electrode 3 are formed at the peripheral portion of chip 1, the first connection pads 6 are close to the second connection pads 7. In that case, the second connection pads 7 are overlapped with the potting region 10. This results in the problem that the first resin 9 is put over the second connection pads 7, as shown in FIG. 17.

As another method of resin sealing, a prior art technique has been proposed in order not to solve the above described problem but to prevent generation of foams or air bubbles as disclosed in Japanese Patent Laying-Open No. 6-89914.

Figure 18:
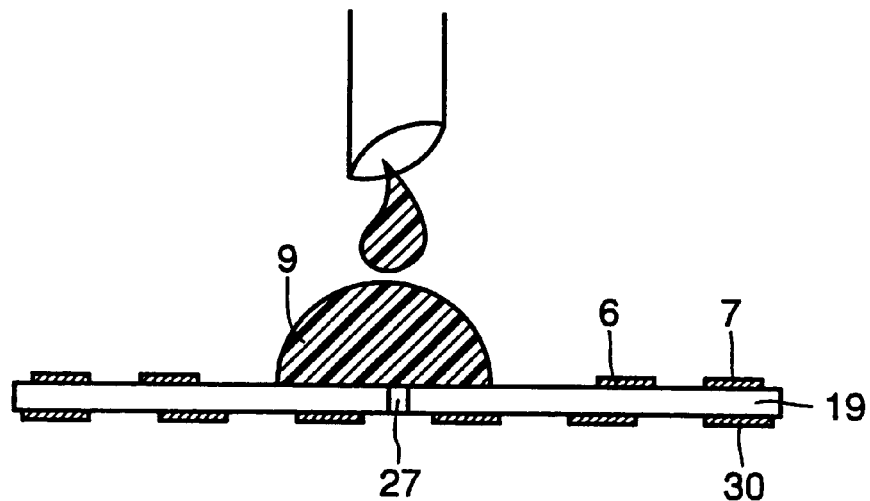

According to this method, referring to FIG. 18, a thermoplastic resin 9 is applied to the central portion of circuit board 1 and temporarily cured. Thereafter, electrodes 3 of chip 1 and the first connection pads 6 of circuit board 19 are registered. Thereafter, pressure is applied in the direction of bringing the electrode 3 of chip 1 to the first connection pad 6 of circuit board 19 and thermoplastic resin 9 is heated and melted so that it diffuses uniformly to the periphery. By utilizing this method, resin sealing may be possible even when sufficient potting region is not ensured.

According to this prior art technique, however, the resin sealing region is not limited, and the amount of application and viscosity of the resin are not controlled at all. Therefore, it is possible that a large fillet 11 may be formed by the resin flowing out to the outer periphery of the chip edge. Therefore, as in the above described method of resin sealing, in a package such as a CSP of which size is close to the bare chip size, the fillet would be formed approximately entirely on the periphery of the circuit board, as the size of the circuit board is approximately the same as the chip size.

Figure 19:
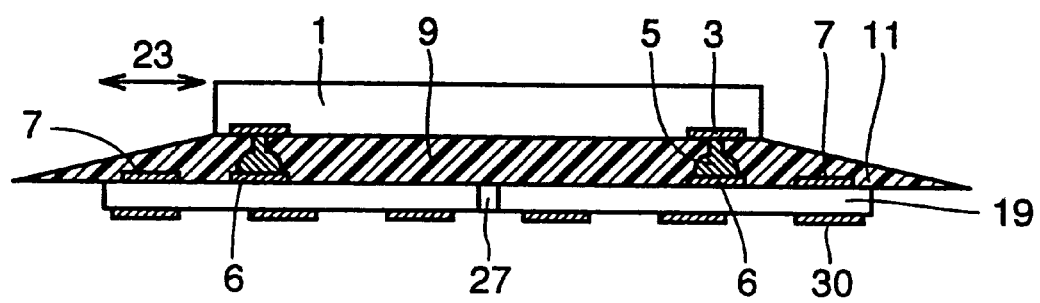

As a result, the problem arises that the first resin 9 extends over the second connection pads 7, as shown in FIG. 19.

Figure 20A:
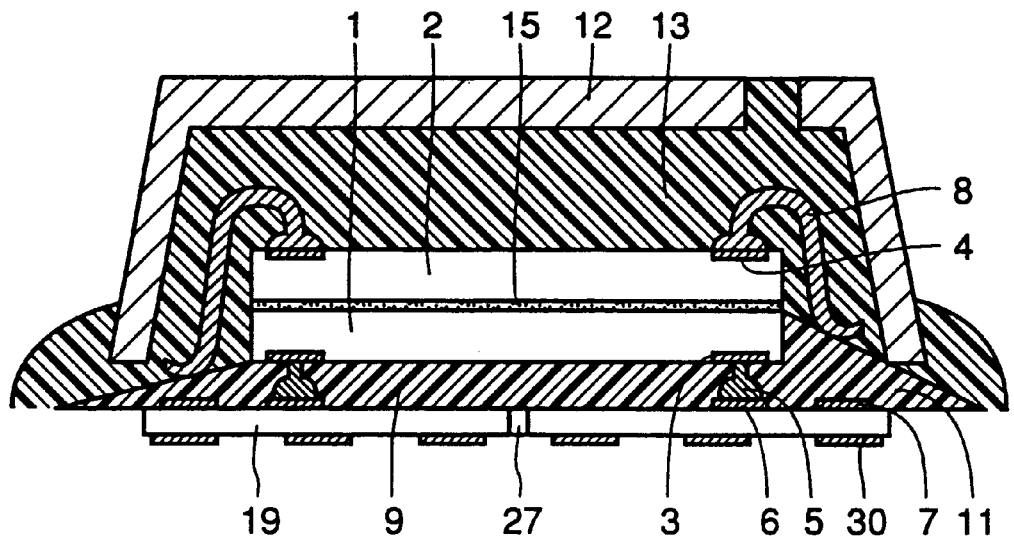
Figure 20B:
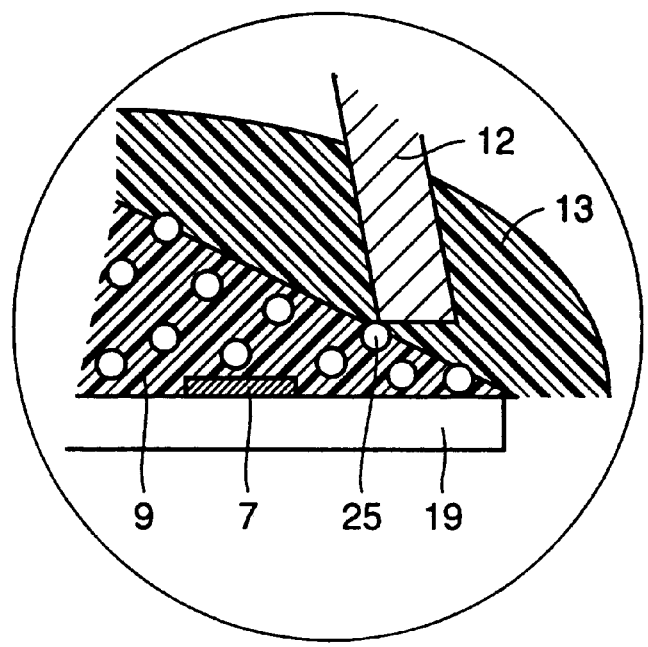

When the circuit board on which the second chip 2 is mounted is further held by a molding tool 12 and a mold resin 13 is poured in the state shown in FIG. 17 or 19, it becomes impossible to maintain airtightness of molding tool 12 because of the fillet 11, resulting in the problem that the mold resin 13 flows to the outside, as shown in FIGS. 20A an 20B. Further, when a filler 25 of SiC or the like is contained in the first resin 9 in order to reduce thermal expansion coefficient, as shown in FIG. 20B, molding tool 12 may possibly be damaged, as the filler 25 is hard. FIG. 20B shows in enlargement a portion of FIG. 20A.

More specifically, when the first connection pad 6 and the second connection pads 7 formed on circuit board 19 are sufficiently apart from each other, either one of the above described two methods of resin sealing may be utilized. When the present invention is applied to a CSP which is a package of which size is made closer to the chip size, however, the above described problems newly arise. In order to solve such problems, it becomes necessary to adjust the amount of use of the first resin.

In the present embodiment, the resin is applied with the amount of use being controlled to be at least 1.1 mm$^3$ and at most 1.6 mm$^3$, for example, to be between 1.2 to 1.4 mm$^3$.

Figure 4B:
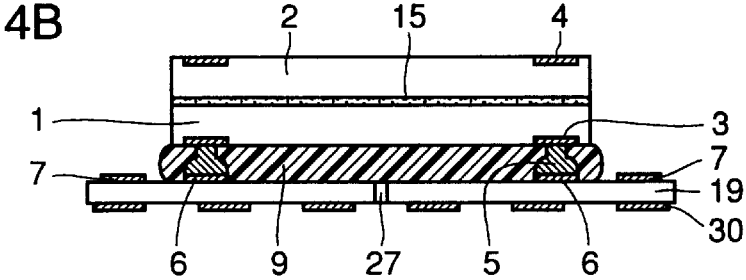

Thereafter, the first and second chips 1 and 2 with rear surfaces connected to each other by adhesive 15 are mounted on circuit board 19, as shown in FIG. 4B. At this time, the first resin 9 extends from the center to the periphery. It may be possible to control the amount of application and resin characteristic of the first resin 9 so that the resin does not cover the first connection pads 6, taking into consideration the possibility of repairing, as in the second embodiment which will be described later.

When the chip is of a KGD (Known Good Die: quality guaranteed), there is little possibility of repairing. Therefore, it is preferred that the extension of the interposed first resin 9 is controlled such that the peripheral portion of the resin extends to be outer than the first connection pads 6 and inner than the region where the second connection pads 7 are formed, on the circuit board 19. In the present embodiment, chip 1 which is a square of 6.3 mm×6.3 mm is used, with the gap from the circuit board 19 being set to 30 $\mu$m.

In the present embodiment, a metal protruded electrode formed of Au is formed on the first connection pad on the circuit board.

Here, the outermost layer of the electrodes of the first chip is generally formed of Al-1% Si. Therefore, bonding between metals is performed by thermocompression bonding of Au—Al. Therefore, it becomes possible to set connection temperature low. Therefore, the present method is effective when the circuit board is thin and prone to warpage or waviness caused by heat.

As another method of connection to obtain electric connection between the metal protruded electrode on the circuit board and the electrode of the first chip, pressure contact between the metal protruded electrode and the electrode may be possible to obtain the electrical connection by curing the first resin 9, if a thermosetting and heat shrinkable resin is used as the first resin 9.

As to the method of mounting the first and second chips on the circuit board, in one method, the first chip is mounted on the substrate, a die bonding agent (adhesive) is applied on the rear surface, the second chip is mounted thereon and thereafter cured by heat. In another method, the rear surfaces of the first and second chips are adhered by a die bonding agent in advance, and thereafter the bonded chips are mounted on the circuit board. A liquid or sheet die bonding agent may be used. As to the method of heat curing, tool heating, oven heating or the like may be utilized.

Figure 4C:
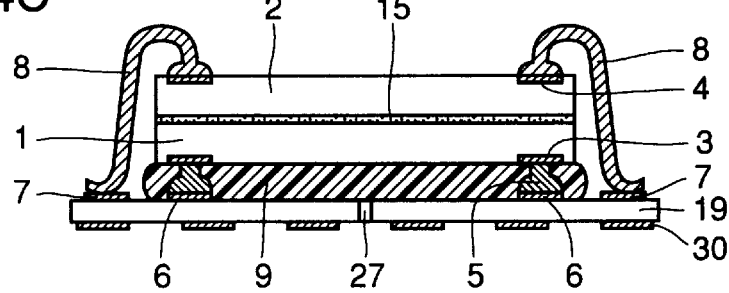

Thereafter, referring to FIG. 4C, electrodes 4 of the second chip and the second connection pads 7 corresponding to the electrodes on circuit board 19 are electrically connected by means of metal wires 8 in accordance with wire bonding method. The electrical connection may be attained by using leads, in place of wires.

As another method of electrical connection between the circuit board and the second chip, the second chip may not be mounted in the step of FIG. 4B, and the second chip may be used as a TCP (Tape Carrier Package), so that electrical connection with the circuit board is attained by utilizing OLB (Outer Lead Bonding) technique.

Figure 4D:
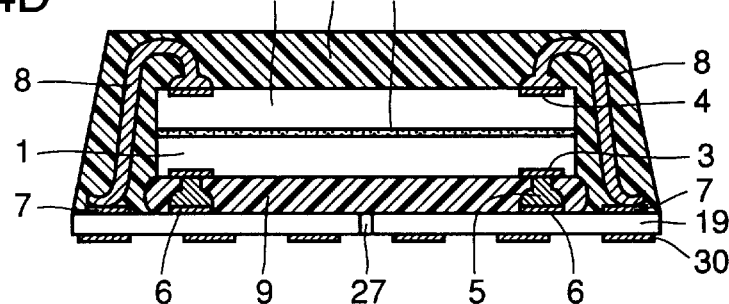

Thereafter, referring to FIG. 4D, the mounting surface including the wire connecting portions formed in the step of FIG. 4C is molded by a thermosetting second resin 13. In the present embodiment, for molding, a molding tool is put on, the second resin 13 is introduced at a temperature of about 180° C., and curing is performed in an oven at a temperature of 140 to 150° C. for 4 to 5 hours. The method of molding is not limited thereto. Liquid sealing resin may be potted on the entire body.

Figure 4E:
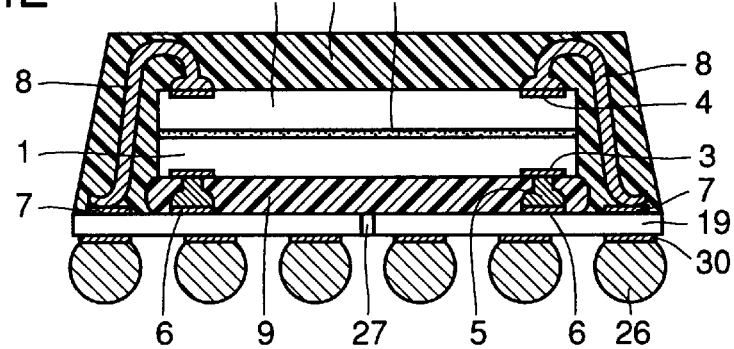

Referring to FIG. 4E, thereafter, solder balls 26 are formed on third connection pads 30 formed in a matrix on a rear surface of the circuit board. As the external input/output terminals are formed on the rear surface of the circuit board in this manner, the number of terminals can be increased as compared with the external input/output terminals arranged around the package. The structure of the external input/output terminals is not limited thereto, and leads may be arranged at the periphery.

The semiconductor device package (CSP) in accordance with the present embodiment formed through the above described steps has an outer size of 8 mm square.

FIGS. 5A to 5E show another example of the process steps for manufacturing the semiconductor device package in accordance with a second embodiment of the present invention.

Figure 5A:
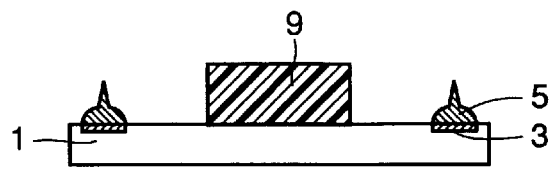
FIGS. 5A to 5E are cross sectional views showing the steps of manufacturing a semiconductor device package in accordance with a second embodiment of the present invention.

Referring to FIG. 5A, first, on electrode 3 of the first chip 1, a metal protruded electrode is formed by metal member 5.

In the present embodiment, an Au wire having the diameter of φ20 μm is used, as an example, and by wire bonding, a metal protruded electrode having the diameter of about 80 μm is formed. Plating or the like may be utilized to form the metal protruded electrode.

In the present embodiment, as a method of interposing the first resin 19 in the gap between the first chip 1 and circuit board 19, the first resin 9 in the shape of a sheet is applied at the central portion of the first chip 1 in advance. At this time, a thermoplastic resin of a 4 mm×4 mm square is used as the first resin sheet 9. As to the characteristics of the resin, glass transition temperature (Tg) is 223° C. and modulus in tension near the connection temperature (about 400° C.) is 8 to 9 MPa.

The sheet has a thickness of 40 μm, for example. The method of applying the resin is not limited thereto. For example, the first resin 9 in liquid shape may be potted by a prescribed amount, by a dispenser, for example.

In the present embodiment, the first resin is applied with the amount of use controlled to be at most 1 mm³ and, for example between 0.5 to 0.7 mm³.

Figure 5B:
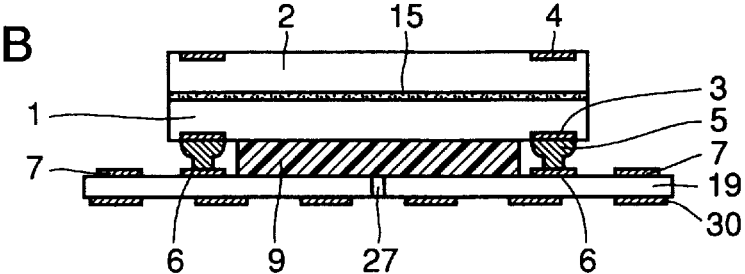

Referring to FIG. 5B, the first and second chips 1 and 2 with rear surfaces adhered to each other by adhesive 15 are mounted on circuit board 19.

At this time, the amount of first resin 9 is controlled such that the resin extends from the center to the periphery but not cover the first connection pads 6, taking into consideration the resin characteristics such as viscosity into consideration, when the resin is applied in the step of FIG. 5A.

In the present embodiment, the chip 1 is a square of 6.3 mm×6.3 mm, and the gap with the circuit board 19 is set to be 30 μm.

In the present embodiment, a flexible substrate including BT resin (bismaleimide triazine: cyanate resin or mixed resin thereof, trade name of Mitsubishi Gas Chemical Co., Inc.) and metal interconnections is used as circuit board 19.

In the step shown in FIG. 5D, which will be described later, circuit board 19 is heated to about 180° C. for curing the mold resin. Therefore, the substrate is adapted to have the glass transition temperature of at least 200° C.

In the present embodiment, the outermost surface of the first connection pads 6 on circuit board 19 is of Au, and the metal protruded electrode is also formed of Au. Therefore, electrical connection between electrode 3 and the first connection pad 6 is attained by metal member 5 through metal bonding, utilizing thermocompression bonding between Au-Au. When the first resin 9 is thermosetting and heat shrinkable, the electrical connection may be obtained by bringing electrode 3 and the first connection pad 6 into pressure contact through metal member 5, by curing the resin, as another method of connection.

Figure 5C:
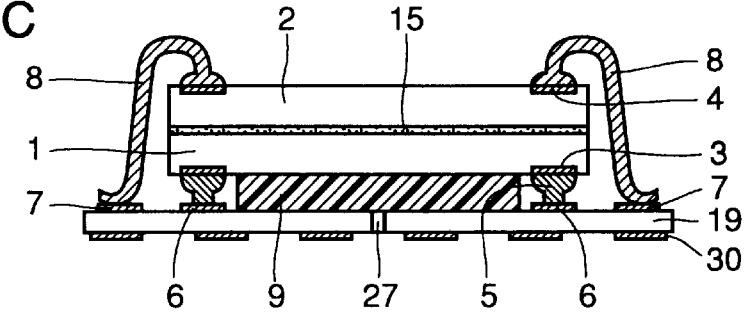

Thereafter, referring to FIG. 5C, the electrode 4 of the second chip 2 is electrically connected to the second connection pad 7 corresponding to the electrode 4 on circuit board 19, by means of metal wire 8 through wire bonding method.

As another example of electrical connection between the circuit board and the second chip, the second chip may not be mounted in the step shown in FIG. 5B and the second chip may be used as a TCP (Tape Carrier Package), so that electrical connection with the circuit board is attained by OLB (Outer Lead Bonding) technique.

In the present embodiment, electrical test of the chip is performed in this step, and if the device is found to be defective, it may be repaired. The steps of repairing are as shown in FIGS. 6A to 6F.

Figure 6A:
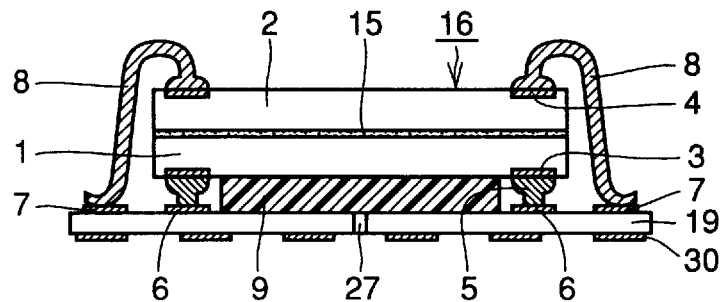
FIGS. 6A to 6F are cross sectional views showing the steps for repairing in the second embodiment of the present invention.

FIG. 6A shows a stacked chip 16 which is found to be defective by the test performed in the step of FIG. 5C before packaging.

Figure 6B:
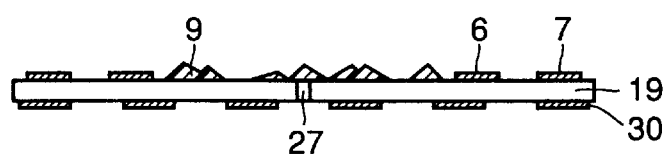

In this case, the defective stacked chip 16 is removed as shown in FIG. 6B. In this embodiment, the first resin is interposed only on the inner side of the region where the first connection pads 6 are formed. Therefore, even when the stacked chip 16 is removed, the first connection pads 6 are not damaged.

Figure 6C:

Then, referring to FIG. 6C, in the similar manner as in the step shown in FIG. 5A, metal protruded electrodes are formed by metal member 5 on the electrodes of the chip to be exchanged, corresponding to the first chip 1, and resin is applied to the central portion.

Figure 6D:
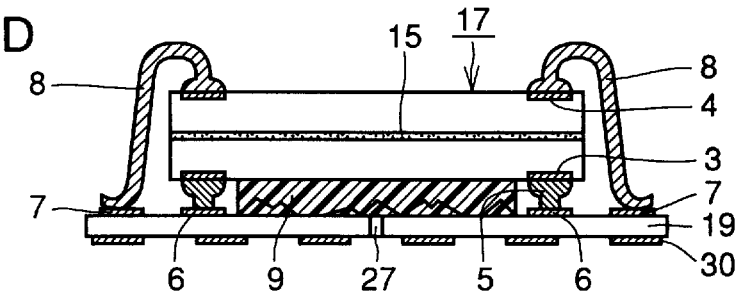

Then, referring to FIG. 6D, in the similar manner as shown in the steps of FIGS. 5B and 5C, a stacked chip 17 for replacement is mounted on circuit board 19.

Figure 5D:
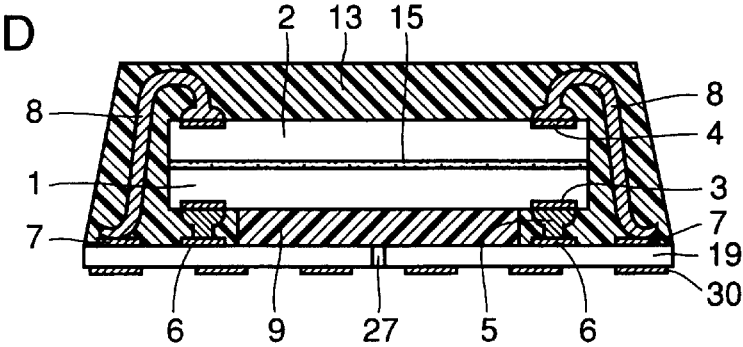
Figure 5E:
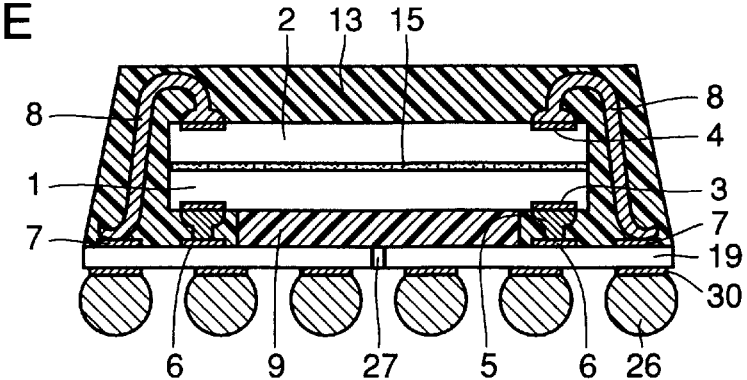
Figure 6E:
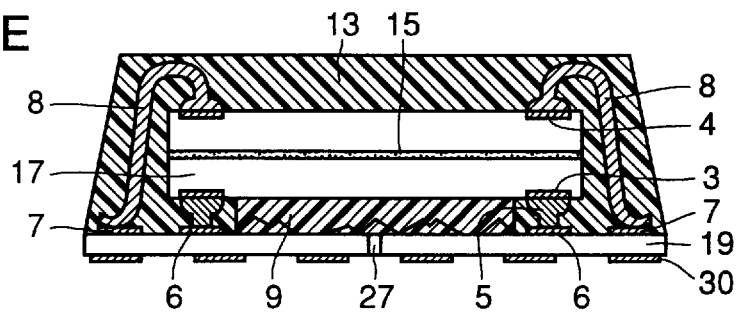
Figure 6F:
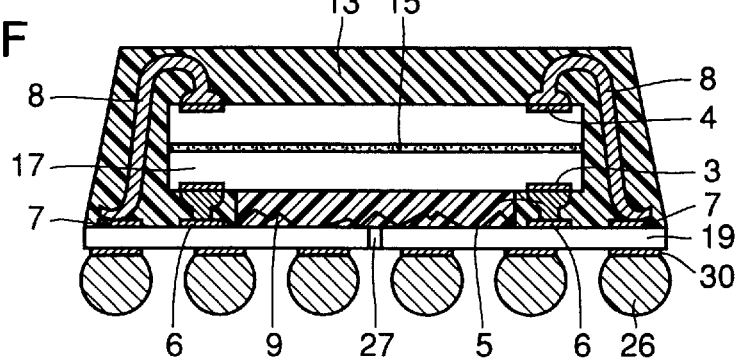

The steps shown in FIGS. 6E and 6F are similar to the step shown in FIGS. 5D and 5E. Therefore, description thereof is not repeated.

Thereafter, referring to FIG. 5D, the mounting surface including the wire connecting portion formed in the step of FIG. 5C as well as the portions not filled with the first resin 9 existing around the metal protruded electrodes formed on the first chip 1 is molded by a thermosetting second resin 13. In the present embodiment, molding is performed by putting on a molding tool, introducing the second resin 13 at a temperature of about 180° C. and curing in an oven at a temperature of 140 to 150° C. for 4 to 5 hours.

The method of molding is not limited to the one described above. Liquid sealing resin may be potted entirely.

Then, referring to FIG. 5E, on the third connection pads 3 formed in a matrix on the rear surface of the circuit board, solder balls 26 are formed. As the external input/output terminals are formed on the rear surface of the circuit board in this manner, the number of terminals can be increased as compared with an example in which the external input/output terminals are arranged on the periphery of the package. The structure of the external input/output terminals is not limited thereto, and leads may be arranged at the periphery.

The semiconductor device package (CSP) in accordance with the present embodiment manufactured through the above described steps has an outer size of 8 mm×8 mm square.

FIGS. 7A to 7E show a still further example of the process steps for manufacturing the semiconductor device package in which a package sealing a chip having elements formed on opposing sides is manufactured.

When the chip having the front and rear surfaces as device forming surfaces is used in place of the two chips used in the process steps in accordance with the first or second embodiment, by utilizing the method of manufacturing a package in accordance with the present invention, it becomes possible to reduce the height of the package without impairing effects and advantages of the embodiment.

Figure 7A:
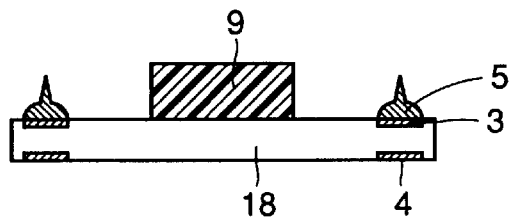
FIGS. 7A to 7E are cross sectional views showing the steps of manufacturing a semiconductor device package in accordance with a third embodiment of the present invention.

First, referring to FIG. 7A, a metal protruded electrode is formed by metal member 5 on electrode 3 on one side of a chip 18. In the present embodiment, an Au wire having the diameter of $\phi 20$ μm is used, and the metal protruded electrode having the diameter of about 80 μm is formed by wire bonding. The metal protruded electrode may be formed by plating or the like.

In the present embodiment, similar to the second embodiment, as a method of interposing resin at the central portion of chip 18, the first resin 9 in the shape of a sheet is applied at the central portion of chip 18 in advance.

This time, a thermoplastic resin of 4 mm×4 mm square is used as the first resin sheet 9, for example. The resin having the resin characteristics of glass transition temperature (Tg) of 223° C. and modulus in tension near the connection temperature (about 400° C.) of 8 to 9 MPa is used.

In the present embodiment, the sheet has a thickness of 40 μm, for example. The method of applying the resin is not limited to the one described above. For example, liquid shape first resin 9 may be potted by a prescribed amount, using a dispenser, for example. In the present embodiment, the resin is applied with the amount controlled to be at most 1 mm³ and, for example, between 0.5 to 0.7 mm³.

Figure 7B:
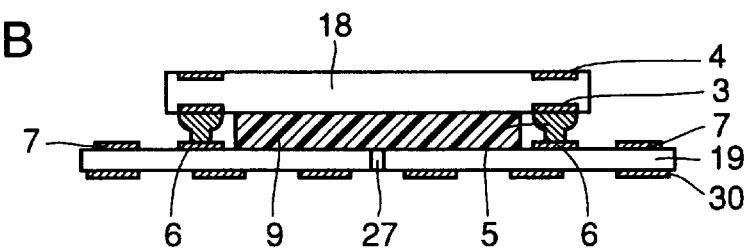

Then, referring to FIG. 7B, chip 18 is mounted on circuit board 19. At this time, the first resin 9 extends from the center to the periphery. Here, the amount of resin is controlled taking into consideration the resin characteristic such as viscosity at the time of application shown in FIG. 7A, so that the resin does not cover the first connection pads 6. In the present embodiment, a chip of 6.3 mm×6.3 mm square is used, and the gap with the circuit board is set to be 30 μm.

In the present embodiment, a flexible substrate including polyimide and metal interconnections is used as the circuit board.

In the step shown in FIG. 7D, which will be described later, circuit board 19 is heated to the temperature of about 180° C., for curing the mold resin. Therefore, the substrate is adapted to have the glass transition temperature of at least 200° C.

In the present embodiment, the outermost surface of the first connection pads 6 on circuit board 19 is of Au and the metal protruded electrode described above is also of Au. Therefore, electrodes 3 and first connection pads 6 are electrically connected through metal members 5 by metal to metal bonding, utilizing thermocompression bonding between Au—Au.

When the first resin 9 is a thermosetting and heat-shrinkable resin, electrical connection can be attained by bringing the electrode 3 and the first connection pads 6 into pressure contact through metal member 5, by curing the resin, as another method of connection.

Figure 7C:
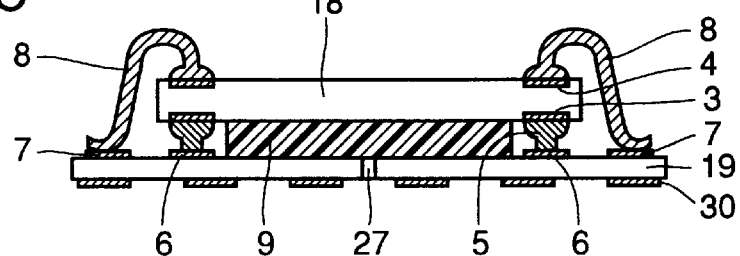

Thereafter, referring to FIG. 7C, electrodes 4 on the upper surface of chip 18 and second connection pads 7 corresponding to electrodes 4 on circuit board 19 are electrically connected through metal wires 8 in accordance with wire bonding method.

As another method of electrical connection between the circuit board and the electrodes on the upper surface of chip 18, the chip 18 may be formed as a TCP (Tape Carrier Package) in the step of FIG. 7B, and electrical connection with the circuit board may be attained by utilizing OLB (Outer Lead Bonding) technique simultaneously with the bonding of metal protruded electrodes.

In the present embodiment, electrical test is performed in the present stage and if the device is found to be defective, repairment is possible. The steps of repairing are approximately the same as those of FIGS. 6A to 6F described with respect to the second embodiment. Therefore, description thereof is not repeated.

Figure 7D:
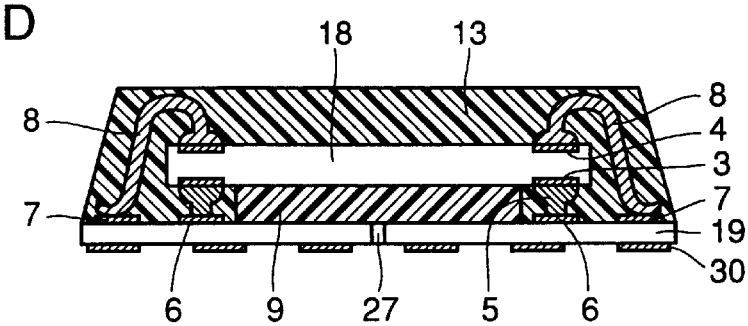

Thereafter, referring to FIG. 7D, the mounting surface including the wire connecting portions formed in the step of FIG. 7C and portions not filled with the first resin 9 existing around the metal protruding electrode 5 formed on chip 18 is molded by a thermosetting second resin 13.

In the present embodiment, for molding, a molding tool is put on, the second resin 13 is introduced at a temperature of about 180° C., for example, and curing is performed in an oven at a temperature of 140 to 150° C. for 4 to 5 hours. The molding is not limited to the method described above. Alternatively, liquid sealing resin may be potted entirely.

Figure 7E:
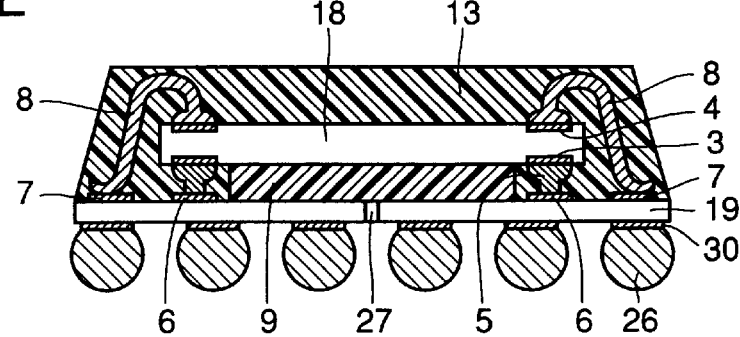

Referring to FIG. 7E, solder balls 26 are formed on the third connection pads 30 formed in a matrix on the rear surface of the circuit board. As the external input/output terminals are formed on the rear surface of the circuit board in this manner, the number of terminals can be increased as compared with an example in which the external input/output terminals are arranged at the periphery of the package. The structure of the external input/output terminals is not limited thereto, and leads may be arranged at the periphery.

The semiconductor package (CSP) in accordance with the present embodiment formed through the above described steps has an outer size of 8 mm×8 mm square.

Figure 8:
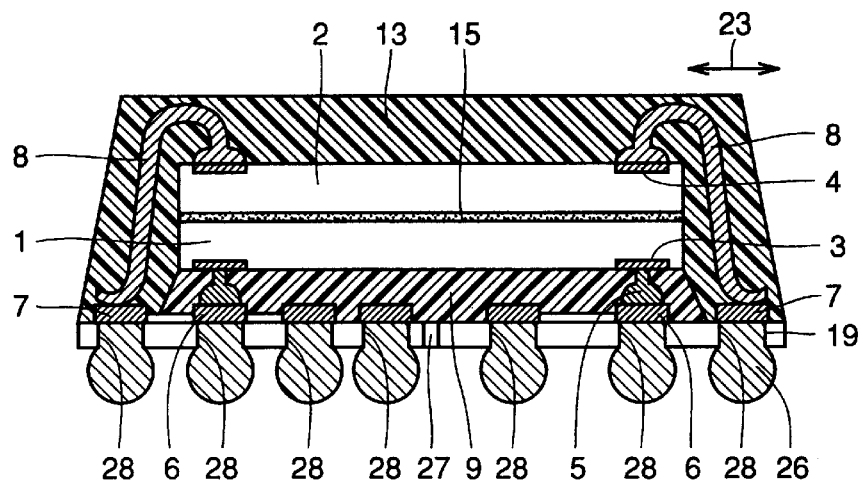
FIG. 8 is a cross sectional view showing a structure of a semiconductor device package in accordance with a fourth embodiment of the present invention.

FIG. 8 is a cross sectional view showing a structure of a semiconductor device package in accordance with the fourth embodiment of the present invention.

Referring to FIG. 8, in the semiconductor device package, a plurality of connection holes 28 are formed in a matrix in circuit board 19. Solder balls 26 are filled in the openings 28.

More specifically, solder balls 26 are connected to the first and second connection pads 6 and 7 formed on the surface of circuit board 19 through openings 28, whereby external input/output terminals are provided.

Except this point, the structure is the same as the semiconductor device package in accordance with the first embodiment shown in FIG. 1. Therefore, description thereof is not repeated.

Figure 9A:
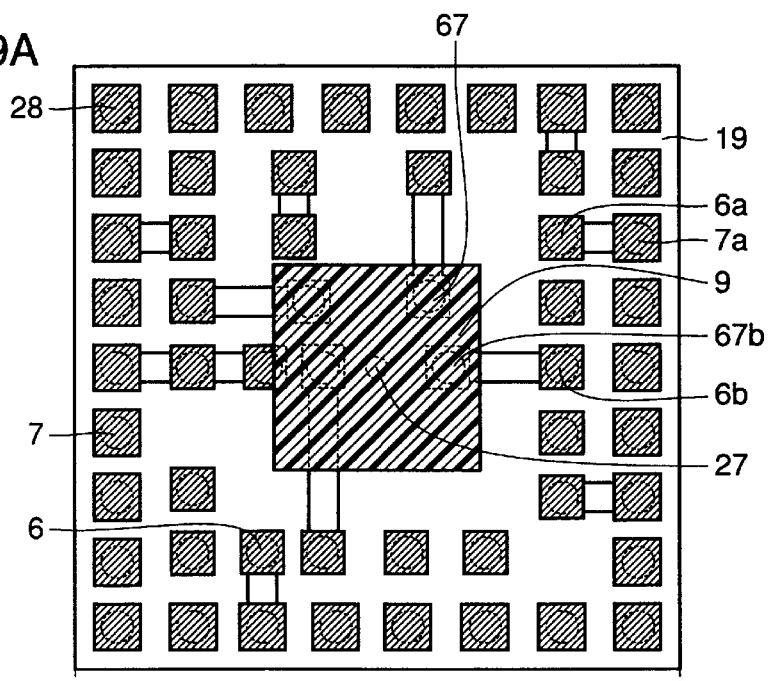
FIGS. 9A and 9B show a circuit board used in the semiconductor device package in accordance with the fourth embodiment of the present invention.
Figure 9B:
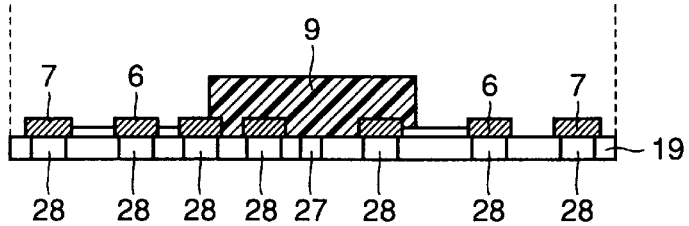

FIGS. 9A and 9B show a circuit board used in the semiconductor device package shown in FIG. 8, in which FIG. 9A is a plan view and FIG. 9B is a cross section.

Referring to FIGS. 9A and 9B, a plurality of first connection pads 6 are formed on the surface of circuit board 19 to be connected to the electrodes of the first chip. Second connection pads 7 are formed outside and around the first connection pads 6 for connection with the electrodes of the second chip.

Third connection pads 67 are further provided inside the first connection pads 6 of circuit board 19. The third connection pad 67 and the first connection pad 6 may be connected, as represented by a third connection pad 67b and the first connection pad 6b, for example. Though not shown, the second connection pad may also be connected to the third connection pad. In that case, an interconnection passes between the first connection pads.

At a portion of the substrate corresponding to that portion where the first, second and third connection pads 6, 7 and 67 are formed, openings 28 for connection are formed. Solder balls are filled in openings 28, whereby external input/output terminals are formed as shown in FIG. 8.

The third pads 67 are formed inside the first connection pads 6 from the following reason. When solder balls 26 are formed at portions corresponding to the first and second connection pads 6 and 7, it is possible that the formed solder balls are too close to each other. Here, if the first connection pad 6 is connected to the third connection pad 67, it becomes unnecessary to form the solder ball corresponding to the first connection pads 6 provided that solder balls are formed at portions corresponding to the third connection pads 67. As a result, distance between each of the solder balls can be made wider. The same applies to the relation between the second and third connection pads.

In FIG. 8, solder balls are formed at portions corresponding to any connection pads, with the first connection pads 6 and third connection pads 67 being connected. When the first and third connection pads are connected, however, the solder balls need be formed only at the portions corresponding to either one of the connection pads. It is not necessary to form solder balls at portions corresponding to both connection pads.

In FIGS. 9A and 9B, openings 28 are formed in the substrate to correspond to all the portions where the connection pads are formed. If the connection pads are connected to each other as in the case of the first connection pad 6b and the third connection pad 67b, for example, opening 28 should be formed at least at that portion of the substrate which corresponds to the portion where either one of the connection pads is formed.

The arrangement of the connection pads are not limited to the one shown in the figure.

Except this point, the structure is similar to the circuit board in accordance with the first embodiment shown in FIGS. 3A and 3B. Therefore, description thereof is not repeated.

Figure 10:
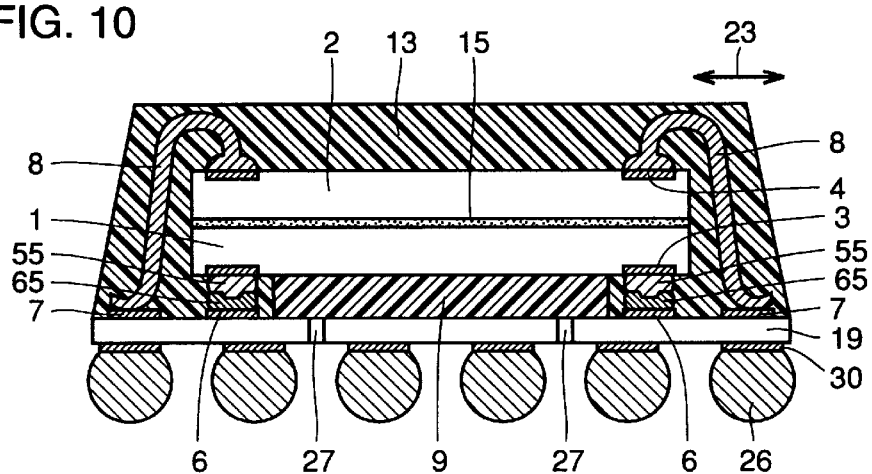
FIG. 10 is a cross sectional view showing a structure of a semiconductor device package in accordance with a fifth embodiment of the present invention.

FIG. 10 is a cross section showing a structure of the semiconductor device package in accordance with the fifth embodiment of the present invention.

Referring to FIG. 10, metal member 5 for adhesion is constituted by two different types of metal portions, that is, a first portion 55 formed of a metal containing Au as a main component, and a second portion 65 formed of solder. A plurality of through holes 27 are formed in the substrate at a region surrounded by the first connection pads.

Except these points, the semiconductor device package is similar to the one in accordance with the first embodiment shown in FIG. 1. Therefore, description thereof is not repeated.

Figure 11A:
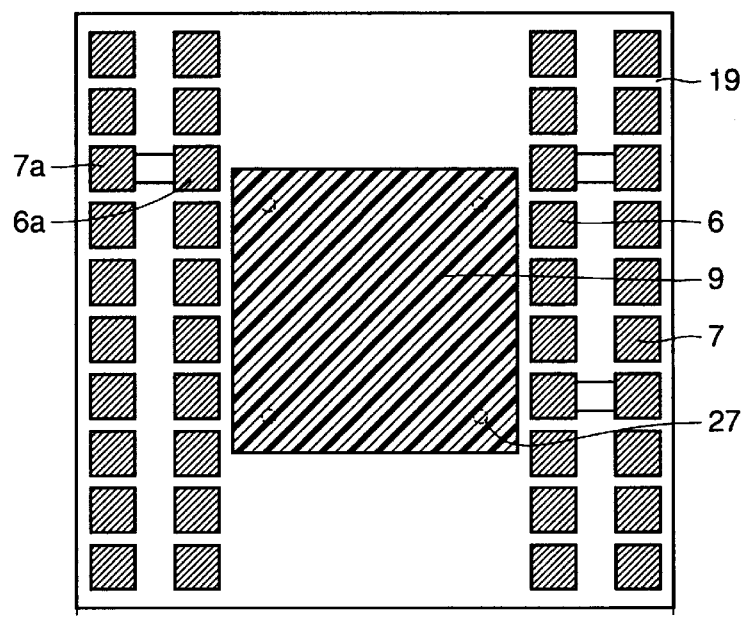
FIGS. 11A and 11B show a circuit board used for the semiconductor device package of FIG. 10.
Figure 11B:
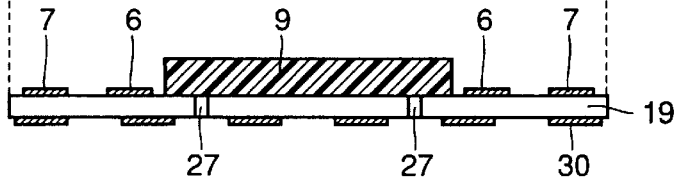

FIG. 11A and FIG. 11B show the circuit board used for the semiconductor device package shown in FIG. 10, in which FIG. 11A is a plan view and FIG. 11B is a cross section.

Referring to FIGS. 11A and 11B, a plurality of through holes 27 are formed in circuit board 19.

Except this point, the circuit board is similar to that of the first embodiment shown in FIGS. 3A and 3B. Therefore, description thereof is not repeated.

The method of manufacturing the semiconductor device package having such a structure will be described with reference to the figures.

FIGS. 12A to 12F are cross sections showing an example of process steps for manufacturing the semiconductor device package shown in FIG. 10.

Figure 12A:
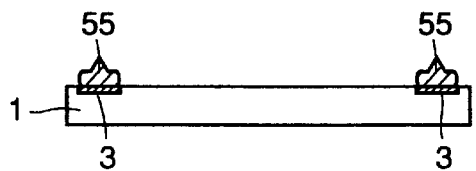
FIGS. 12A to 12F are cross sectional views showing examples of steps of manufacturing the semiconductor device package shown in FIG. 10.

Referring to FIG. 12A, a metal protruded electrode is formed as a first portion 55 of the metal member for adhesion, on the first electrode 3 of the first chip 1 of the semiconductor device package shown in FIG. 10. In the present embodiment, an Au wire having the diameter of $\phi 20$ $\mu$m is used as an example, and the metal protruded electrode having the diameter of about 80 $\mu$m is formed by wire bonder. The metal protruded electrode may be formed by plating, for example.

Figure 12B:
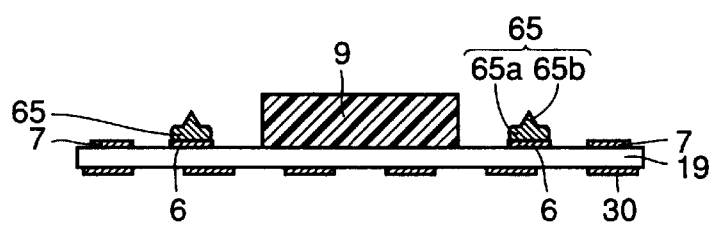

Thereafter, referring to FIG. 12B, solder is supplied by ball bonding method onto the first connection pad 6 of the circuit board 19 shown in FIGS. 11A an 11B, and a solder protruded electrode is formed as the second portion 65 of the metal member for adhesion. In the present embodiment, a substrate including metal interconnections and polyimide having glass transition temperature of at least 200° C. is used as the circuit board. For supplying solder, a solder wire having the composition of Sn 97%—Ag 3%, melting point of 221° C. and the diameter of $\phi 40$ $\mu$m is used, utilizing a wire bonder.

In the ball bonding method, tip end of the wire is heated by discharge to form a ball. In order to prevent oxidation, the ball is bonded by thermocompression bonding to the first connection pad 6 of circuit board 19 in a reducing atmosphere of Ar-10% $H_2$, and ball and wire are separated. Thus the solder protruded electrode 65 having the diameter at the bottom portion 65a of about 120 to about 140 $\mu$m is formed.

Figure 13:
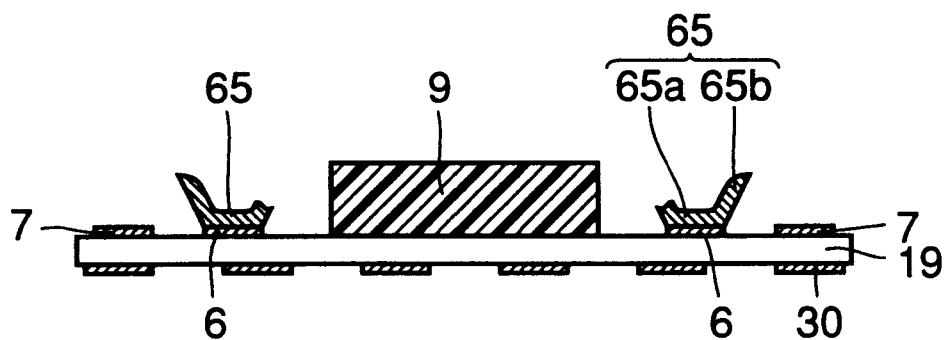
FIG. 13 is a cross sectional view showing an exemplary step of manufacturing the semiconductor device package in accordance with the present invention.

FIG. 13 is a cross section illustrating a method of forming the solder protruded electrode by wedge bonding method, which shows a step corresponding to FIG. 12B.

Referring to FIG. 13, in the wedge bonding method, the step of heating by discharge is unnecessary. Further, reducing gas is not used, either. The solder wire is directly squashed on the first connection pad 6 by means of a wedge, compression bonding is performed by ultrasonic wave, the wire is cut and thus the solder protruded electrode 65 having the width of 80 μm and thickness of about 20 μm at the bottom portion 65a is formed.

Figure 14:
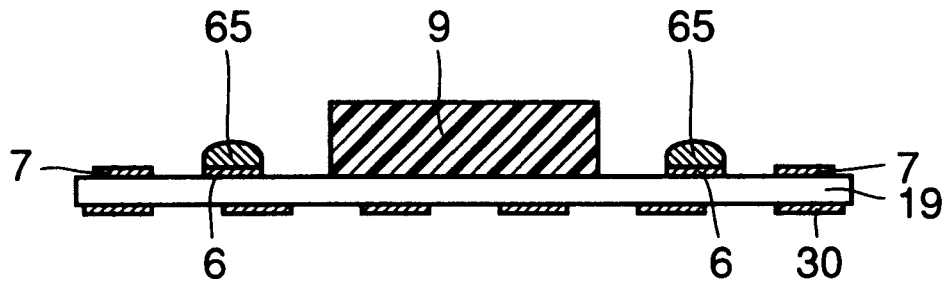
FIG. 14 is a cross sectional view showing another exemplary step of the method of manufacturing a semiconductor device package in accordance with the present invention.
Figure 15:
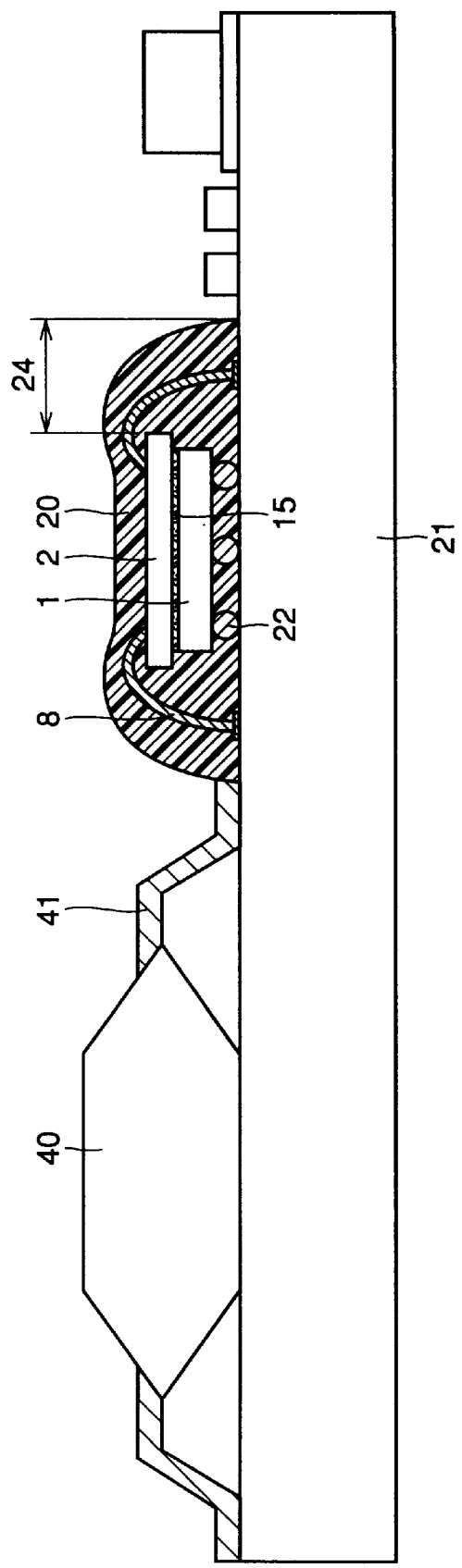
FIG. 15 is a cross sectional view showing an example of a conventional method of mounting a semiconductor device.

When a tail 65b of solder protruded electrode 65 shown in FIG. 12B or FIG. 13 is so long as to cause difficulty in bonding, a flux of RMA type which can make wet extension smaller is applied to solder protruded electrode 65, and the circuit board 19 is put in a reflow furnace of which peak temperature is 230° C., whereby the shape of the solder protruded electrode 65 can be adjusted to almost hemispherical, as shown in FIG. 14.

The composition of the solder is not limited to Sn 97%—Ag 3%. An alloy of Ag and Sn of different compositions, or other alloy such as eutectic solder, may be used.

Further, in the present embodiment, as a method of interposing the first resin 9 in the gap between the first chip 1 and circuit board 19, the first resin 9 in the shape of a sheet is arranged at the central portion of circuit board 19 in advance. In the present embodiment, an epoxy based adhesive sheet having the thickness of 30 μm is used as the first resin sheet 19.

Figure 12C:
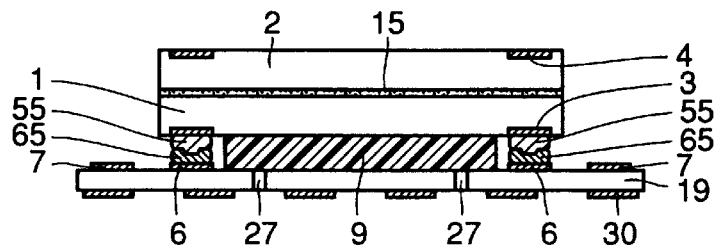

Thereafter, referring to FIG. 12C, on the circuit board 19 heated to a temperature higher than the melting point of solder to melt the solder protruded electrodes 65, the first chip 1 is mounted, and the first electrode 3 are connected to the first connection pads 6. Thereafter, a die bonding agent (adhesive) 15 is applied to the rear surface of the first chip 1, a second chip 2 is mounted thereon and heated and cured.

When the first chip 1 is mounted on the circuit board 19, the first resin 9 extends from the center to the periphery. Here, in order to prevent the resin from pushing away the melt solder protruded electrodes 65, the amount of application of the resin should be controlled taking into consideration the resin characteristic such as viscosity, at the time of application shown in FIG. 12B. Further, if the circuit board 19 is very thin and suffers from considerable warpage or waviness if the substrate 19 is heated to a temperature higher than the melting point of solder, the solder is melted when the first portion 55 of the metal member for adhesion is brought into contact with the solder protruded electrode 65, so as to connect the first electrode 3 and the first connection pad 6. Alternatively, connection may be performed at an optimal temperature condition by keeping the heating temperature on the side of the circuit board 19 to be lower than the melting point of solder while heating the first chip 1 as well.

Figure 12D:
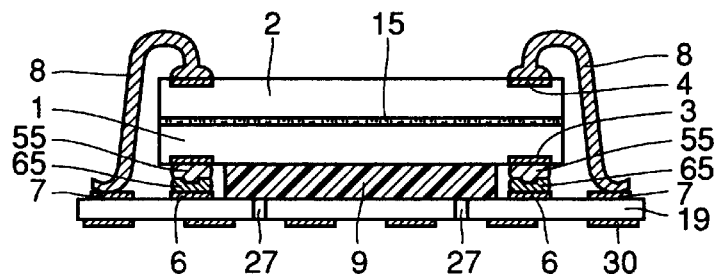

Then, as shown in FIG. 12D, the second electrode 4 of the second chip 2 and the second connection pads 7 of circuit board 19 corresponding to the electrodes 4 are electrically connected by wire bonding by means of metal wires 8. Electrical connection may be attained by means of leads, other than wires.

Figure 12E:
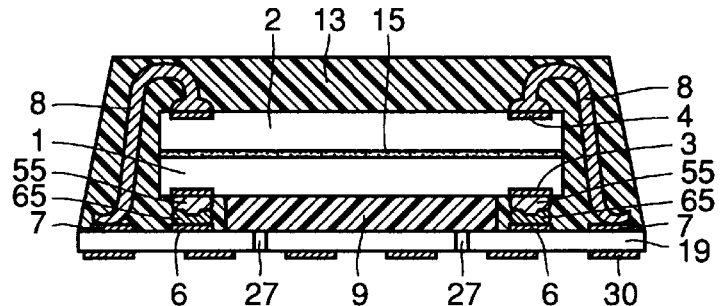

Referring to FIG. 12E, the mounting surface including the wire connection portions formed in the step of FIG. 12D is molded by a thermosetting second resin 13. In the present embodiment, for molding, a molding tool is put on, the second resin 13 is introduced at a temperature of about 180° C. and curing is performed in an oven at a temperature of 140 to 150° C. for 4 to 5 hours. The method of molding is not limited thereto, and alternatively, liquid resin may be potted entirely.

Figure 12F:
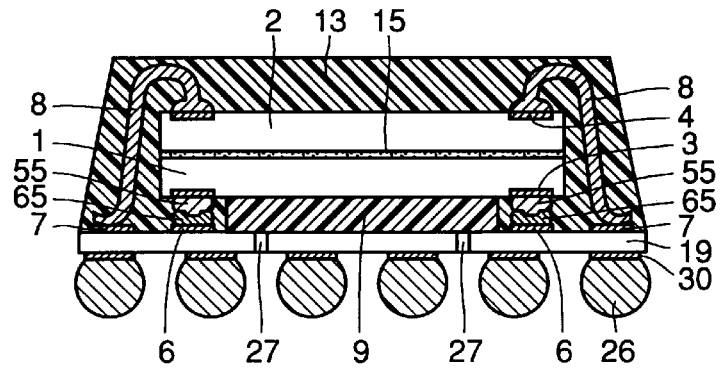

Referring to FIG. 12F, on the third connection pads 30 formed in a matrix on the rear surface of circuit board 19, solder balls 26 are formed. As the external input/output terminals are formed on the rear surface of circuit board 19 in this manner, the number of terminals can be increased as compared with an example in which the external input/output terminals are arranged on the periphery of the package. The structure of the external input/output terminals is not limited thereto and leads may be arranged at the periphery.

In the present embodiment, the temperature of bonding can be decreased to be lower than 400° C., as compared with the example in which Au is used as the metal member for adhesion when the first chip is connected by the flip chip method to the circuit board and where the bonding portion is Au—Au bonding or Au—Al bonding.

Further, when solder is used as the metal member for adhesion in order to allow connection at a relatively low temperature, bonding between solder and Al is difficult and therefore it becomes necessary to form a Cr layer as an adhesive layer, for example, on the Al electrode 3 of the first chip 1 and further to form diffusion preventing layer of Cu or Ni by plating or vacuum deposition. In the present embodiment, however, there is not such necessity. Therefore, the number of process steps is not increased, and hence manufacturing cost is not increased.

In the structure of the first embodiment shown in FIG. 1, there is a method of lowering the bonding temperature in which solder is supplied to the first connection pad, a metal protruded electrode containing Au as a main component is provided by ball bonding method on the first electrode 3 of the first chip 1, the pad and the electrode are connected by flip chip method and Au-solder bonding is performed. Here, as a method of supplying solder, printing is possible. In this case, it is difficult to supply a small amount of solder clean stably with high precision to find pads with narrow pitch. By contrast, according to the present embodiment, solder is supplied by ball bonding method or wedge bonding method, and therefore stable supply is possible.

Further, different from the superjuffit method or super solder method in which the solder is pre-coated on the circuit board, it is not necessary to perform solder precoating only on the first pads. Therefore, it is not necessary to form a mask on the second pads or interconnections on the circuit board in advance. Further, it is unnecessary to remove the mask after supplying the solder either. Therefore, the number of process steps as well as cost are not increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device package, comprising:
a plurality of first electrodes formed on a periphery of a first semiconductor device forming surface,
a plurality of second electrodes formed on a periphery of a second semiconductor device forming surface; and
a circuit board for mounting said semiconductor device thereon,
said circuit board including
a plurality of first connection pads, formed thereon each of which are connected to a corresponding one of said plurality of first electrodes by corresponding ones of a plurality of metal members, a plurality of second connection pads formed thereon, each of which are interconnected to a corresponding one of said plurality of second electrodes by corresponding ones of a plurality of metal wires, a first resin provided in a gap defined between said first semiconductor device forming surface and said circuit board and bounded by said plurality of metal members, wherein said first resin substantially fills said gap but does not contact said plurality of metal members, forming spaces therebetween;

a second resin entirely covering said first and second semiconductor device forming surfaces so as to form the outer shape of the device package flush with ends of said circuit board, wherein said second resin fills said spaces formed between said first resin and said plurality of metal members.

2. The semiconductor device package according to claim 1, wherein said first and second device forming surfaces form part of first and second semiconductor chips with rear surfaces bonded to each other.

3. The semiconductor device package according to claim 1, including at least one semiconductor chip having opposing surfaces as device forming surfaces.

4. The semiconductor device package according to claim 1, wherein said first resin is interposed in the gap between said first device forming surface and said circuit board such that an outer peripheral portion of said first resin covers said metal members and said plurality of first connection pads, but does not contact said second connection pads.

5. The semiconductor device package according to claim 1, wherein said first resin is a thermoplastic resin, and said second resin is a thermosetting resin.

6. The semiconductor device package according to claim 1, wherein each of said plurality of metal members include Au as a main component.

7. The semiconductor device package according to claim 1, wherein each of said plurality of metal members include a first portion formed of a first metal, and
a second portion formed of a second metal.

8. The semiconductor device package according to claim 7, wherein
said first portion is formed of a metal containing Au as a main component, and said second portion is formed of solder.

9. The semiconductor device package according to claim 1, said circuit board further including a plurality of external input/output terminals electrically connected to said first and second connection pads.

10. The semiconductor device package according to claim 9, wherein said external input/output terminals are arranged in a matrix on the second surface of said circuit board; and
each of said external input/output terminals is formed by a third connection pad provided on said second surface and a solder ball provided on said third connection pad.

11. The semiconductor device package according to claim 9, wherein
said circuit board has openings for connection arranged in a matrix; and
said external input/output terminals are formed by solder balls connected to said first and second connection pads through said openings.

12. The semiconductor device package according to claim 1, wherein said plurality of metal members connect said plurality of first connection pads to said corresponding plurality of first electrodes by a flip chip method.

13. A circuit board for manufacturing a semiconductor device package by mounting a semiconductor device having first and second device forming surfaces, comprising:
a substrate having first and second surfaces and at least one through hole;

first connection pads formed for connection with first electrodes which are formed at a peripheral portion of said first device forming surface and surround said through hole to form a region;

second connection pads formed for connection with second electrodes which are formed at a peripheral portion of said second device forming surface;

a first resin applied to that region which is surrounded by said first connection pads said first resin substantially filling said region but not contacting said first connection pads, forming spaces therebetween; and a second resin applied to said substrate for covering said first and second device surfaces.

14. The circuit board according to claim 13, wherein said substrate is formed of a resin having glass transition temperature of at least 200° C.; and
wherein said circuit board further includes:
third connection pads, and
a metal wire for connecting each of said third connection pads to a corresponding one of said first or second connection pad.

15. The circuit board according to claim 13, wherein said second connection pads are provided outside of said first connection pads on said substrate.

16. A semiconductor device package, comprising
a first semiconductor chip having a plurality of first electrodes formed thereon at a periphery;

a second semiconductor chip connected to said first semiconductor chip;

a circuit board for mounting said first and second semiconductor chips thereon, wherein said first semiconductor chip is mounted to said circuit board via a plurality of metal members so as to form a gap between a surface of said first chip and a surface of the circuit board;

a first resin provided so as to substantially fill said gap while not contacting said plurality of metal members, thereby forming spaces therebetween; and a second resin overlaying said first and second semiconductor chips so as to form an outer shape of the semiconductor package device which is flush to ends of said circuit board, wherein said second resin fills said spaces formed between said first resin and said plurality of metal members.

17. The device of claim 16, wherein said circuit board further includes first and second connection pads, and wherein said first and second semiconductor chips further include a plurality of first and second electrodes respectively formed thereon at a periphery, said first electrodes connected to said first connection pads via said plurality of metal members, said second electrodes to said second connection pads via a plurality of metal wires.

18. The device of claim 17, wherein said circuit board further includes a plurality of external input/output terminals electrically connected to said first and second connection pads, each of said plurality of external input/output terminals formed by third connection pads on a surface of said circuit board opposite to a surface on which said first and second connection pads are mounted, said third connection pads being soldered to a substrate of an electrical component.

19. The device of claim 16, wherein said first resin is a thermoplastic resin and second resin is a thermosetting resin.

20. The device of claim 16, wherein said plurality of metal members include Au as a main component.

* * * * *